US007170420B2

(12) United States Patent
Phifer

(10) Patent No.: US 7,170,420 B2
(45) Date of Patent: Jan. 30, 2007

(54) ERGONOMIC TELEVISION REMOTE CONTROL

(76) Inventor: James Phifer, 31 Timberlane Dr., Magnolia, AR (US) 71750

(*) Notice: Subject to any disclaimer, the term of this patent is extended or adjusted under 35 U.S.C. 154(b) by 138 days.

(21) Appl. No.: 10/712,442

(22) Filed: Nov. 13, 2003

(65) Prior Publication Data

US 2005/0104742 A1 May 19, 2005

(51) Int. Cl.
*G08C 9/00* (2006.01)
*H04N 5/44* (2006.01)
*H03M 11/00* (2006.01)

(52) U.S. Cl. ........................... 340/825.69; 340/825.72; 348/734; 341/22

(58) Field of Classification Search ........... 340/825.72, 340/825.69; 341/176, 22, 20; 248/127, 248/146; 200/330, 18; 345/158, 161; 348/734; 455/151.2
See application file for complete search history.

(56) References Cited

U.S. PATENT DOCUMENTS 4,052,582 A * 10/1977 Mullen et al. .............. 200/330
5,038,144 A 8/1991 Kaye .......................... 341/176
5,457,448 A * 10/1995 Totsuka et al. ........ 340/825.72
5,644,303 A 7/1997 Gioscia ................. 340/825.72
5,701,123 A * 12/1997 Samulewicz ................. 341/22
5,724,106 A 3/1998 Autry et al. ................ 348/734
5,805,256 A * 9/1998 Miller ........................ 348/734
5,812,085 A 9/1998 Barraza et al. ............. 341/176
5,973,757 A 10/1999 Aubuchon et al. .......... 348/734
5,982,355 A 11/1999 Jaeger et al. .............. 345/161
6,008,777 A 12/1999 Yiu ............................... 345/2
6,144,367 A * 11/2000 Berstis ....................... 345/158
6,441,770 B2 8/2002 Russell ....................... 341/176
6,473,023 B1 10/2002 Takagi et al. ............... 341/176
6,483,440 B1 * 11/2002 Welch ................... 340/825.72
6,549,143 B1 * 4/2003 O'Donnell et al. .... 340/825.72
6,573,854 B1 6/2003 Hug et al. .................. 341/176
6,587,067 B2 7/2003 Darbee et al. .............. 341/176
2002/0196174 A1 12/2002 Lai ............................ 341/176
2003/0095048 A1 5/2003 Choi et al. ............. 340/825.69

* cited by examiner

*Primary Examiner*—Wendy R. Garber
*Assistant Examiner*—William Bangachon
(74) *Attorney, Agent, or Firm*—Michael Diaz

(57) ABSTRACT

A control stick-shaped, programmable TV remote control device fixed to a base, including a infrared diode and circuitry for transmitting control signals to a television, VCR, or DVD. The ergonomic design provides a plurality of conveniently located switches for single handed control of a television, including a five position thumb switch controlling TV volume up, volume down, mute, channel up, and channel down. The quick access control stick switches may be user programmable. A microprocessor retains user selected and programmed television channels that are sequentially accessed by an index-finger trigger switch. Infrequently used television controls, such as picture quality adjustments, are located on a television control panel on the base. Similarly, VCR and DVD controls are also located on a control panel on the base. Batteries, mounted within the fixed base, provide weight to keep the remote control upright.

16 Claims, 4 Drawing Sheets

ERGONOMIC TELEVISION REMOTE CONTROL

BACKGROUND OF THE INVENTION

1. Technical Field of the Invention

The present invention relates to remote control devices for controlling electrical and electronic appliances, and particularly to an ergonomically shaped infrared remote control unit for operating a television set, the unit having a housing in the shape of a control stick fixed to a base.

2. Description of Related Art

Hand-held remote control devices have long been used to conveniently control television sets without abandoning the comfort of the couch or chair from which the television is being viewed. Early remote devices were small rectangular units controlling an on-off function, the volume, and a TV channel up or down selection. With the growth in the home audio-visual market, the hand-held remote devices have evolved by adding keypads, triggers, and track balls. Multifunction and universal remote units, controlling several electronic devices, are in use. The physical size of the remote has increased, becoming more elongated to include the greater number of control functions.

The increased size has resulted in the television remote control becoming unwieldy for single-handed use. Typically, an operator has pointed the remote at the desired electronic appliance, awkwardly tipping the operator's wrist forward in an uncomfortable position. The operator further was required to balance the remote in his fingers, while manipulating the remote's controls with his thumb. If the operator momentarily relaxed his grip while holding the remote near its ends, the remote would tip forward or rearward, often falling on the floor. Not only does television remote control operation tire the hand and wrist of a user, repetitive operation may subject a user to injuries such as carpel tunnel syndrome.

The conventional shape of the television remote control has not only been uncomfortable to use, it is frequently misplaced. Because it is flat, the traditional remote is easily covered by magazines or newspapers. Frequently, the elongated remote is lost in the folds and pillows of easy-chairs and couches. While the conventional remote control has been designed with a great variance in the number or inclusion of push buttons, switches, triggers, and track balls, a few remote control devices have altered the shape of the housing itself to enhance the usefulness to the operator.

Although there are no known prior art teachings of a device such as that disclosed herein, prior art references that discuss subject matter that bears some relation to matters discussed herein are U.S. Pat. No. 5,644,303 to Gioscia (Gioscia), U.S. Pat. No. 5,724,106 to Autry et al. (Autry), U.S. Pat. No. 5,973,757 to Aubuchon et al. (Aubuchon), U.S. Pat. No. 5,812,085 to Barraza et al. (Barraza), U.S. Pat. No. 6,573,854 B1 to Hug et al.(Hug) and U.S. Pat. No. 5,694,153 to Aoyagi et al. (Aoyagi). These patents discuss shaped housing for remote controllers.

Gioscia discloses the use of a universal remote control with a specialized shape, which is intended to be easily gripped in the hand. The specialized housing is V-shaped in orthogonal cross sections so that it is wider at the top than at the bottom in the front view, whereas it is narrower at the top and wider at the bottom in the side view so as to achieve a generally cylindrical feel when held in the hand. This slight modification to the housing of the remote may fit the user's hand better than an elongated flat remote, but the user is still subject to wrist strain by tilting and pointing the Gioscia remote unit. Gioscia's remote also retains the slim nature of conventional television remote controls that are subject to frequent misplacement. Gioscia does not teach nor suggest the use of an upright free standing remote intended to prevent loss.

In another prior art apparatus, Autry discusses the use of a shaped remote control for a home entertainment system that has a computer with a large VGA quality monitor as the heart of the system. Autry's remote control modifies the traditional flat remote by including a tracking ball on top of the remote, a trigger button on the bottom of the remote, and a slight rearward bend to the aft portion of the remote when viewed from the side. This bend is intended to relieve the operator's wrist strain, however a subsequent Patent by Aubuchon further modifies Autry's design.

Aubuchon also discloses the use of a shaped remote control for a home entertainment system with a computer. Aubuchon's remote has an elongated rectangular housing with a front longitudinal portion and a considerably shorter rear end portion which is downwardly and rearwardly inclined relative to the front portion and has a generally bulbous underside section which may be grasped from below by a control hand of a user, with the elongated front portion extending forwardly beyond the control hand. The device is stabilized against forward tipping in the user's hand by positioning somewhat more than half of the operating weight of the device in its rear end portion. Various control buttons are positioned on the top side of the front portion of the remote. A track ball and associated two topside selection buttons are positioned to be used by the operator's control hand thumb, and an auxiliary selection button positioned on the remote's underside is intended to be used trigger-like by the operator's control hand index finger. Aubuchon's remote, like Autry's remote, still requires the operator to rotate and awkwardly tip his wrist while pointing the remote device at the parent receiving unit. The slim nature of Aubuchon's and Autry's remote are also subject to frequent misplacement. Neither Aubuchon nor Autry teach nor suggest the use of an upright free standing remote intended to prevent loss.

Still another prior art Patent by Barraza discloses several embodiments of an air mouse device used to control various electronic appliances such as a TV. Some of Barraza's housings require the operator to rotate and tip his wrist while pointing the remote, while other housings disclosed by Barraza require a more upright hand position. Although an operator experiences less wrist strain using the upright Barraza designs, an operator is required to use his thumb as the primary means to activate switches in the upright design. Barraza's air mouse does not teach nor suggest user input controls through the extensive use of other hand digits, such as the use of the index finger to press a trigger or the use of the small finger to press a button. Barraza's compact air mouse, like the small traditional TV remote control, is also subject to frequent misplacement. Barraza does not teach nor suggest the use of an upright free standing remote intended to prevent loss.

In yet another prior art apparatus redesigning the housing of a remote control, Hug describes a pistol-shaped television remote control unit. Hug's design provides a plurality of readily accessible switches, including a trigger which changed the channel to the channel previously selected, three volume control switches on the inside of the grip (volume up, down and mute) for operation by the middle, ring and little fingers, a function keyboard on the back of the grip, and picture adjustments on the side of the grip. Hug's design eases wrist strain, but provides minimal controls directly under a user's hand digits. Hug's pistol-shape housing may also be found offensive by many users concerned about perceived violence in the home environment. Hug's remote control, similarly to the elongated rectangular remote units, lays flat and can easily be covered by papers or the like. A lost or hidden remote control device often frustrates the television viewer. Hug does not teach nor suggest the use of an upright free standing remote, intended to prevent user frustration when the television remote control is misplaced.

In still another prior art apparatus Aoyagi discloses a wireless joystick system for inputting computer signals. Aoyagi's device has a handle that is moveably received by a housing in at least three perpendicular directions, i.e. the x, y and z axis (with a ability to rotate in at least one of these axis. Aoyagi discloses the use of a microprocessor to output the position and orientation of the handle's coordinates to a host computer. The Aoyagi joystick includes switches that produce signals and a slidable member that produces a variable signal, all of which are also output to a computer. The Aoyagi joystick, much like wireless gaming joysticks, input gaming signals to a computer not directly to a television. Aoyagi does not teach or suggest inputting signals to a television to control the television viewing functions, i.e. changing the television channel or modify the television volume.

Accordingly, it has been found that a need exists for an ergonomic design of a television remote control device that is easier to find, hold, and activate. A design that stands vertically to prevent loss. A design is needed that provides a large number of quick access, programmable, and easy to use switches, a design that aesthetically relieves wrist strain. It is an object of the present invention to provide such a device.

SUMMARY OF THE INVENTION

In one aspect, the present invention is a control stick-shaped, programmable TV remote control device fixed to a base, including a infrared diode and circuitry for transmitting control signals to a television. The ergonomic design provides a plurality of conveniently located switches for single handed control of a television, including a multi-position thumb switch which may control TV volume and TV channel selection. The quick access control stick switches may be user programmable, accommodating individual user preferences. A microprocessor may retain user selected and programmed television channels that may be sequentially accessed by an index-finger trigger switch. Infrequently used television controls, such as picture quality adjustments, may be located on a television control panel on the base. Batteries, mounted within the fixed base, provide weight to keep the remote control upright.

In another aspect, the present invention is a control stick-shaped, programmable TV and VCR remote control device fixed to a base, including a infrared diode and circuitry for transmitting control signals to a television and a VCR. The ergonomic design provides a plurality of conveniently located switches for single handed control of a television, including a multi-position thumb switch which may control TV volume and TV channel selection. The quick access control stick switches may also be user programmable, accommodating individual user preferences. A microprocessor may retain user selected and programmed television channels that may be sequentially accessed by an index-finger trigger switch. Infrequently used television controls, such as picture quality adjustments, may be located on a television control panel on the base. Similarly, infrequently used VCR controls may also be located on a control panel on the base. Batteries, mounted within the fixed base, provide weight to keep the remote control upright.

In still another aspect, the present invention is a control stick-shaped, programmable TV and DVD remote control device fixed to a base, including a infrared diode and circuitry for transmitting control signals to a television and a DVD. The ergonomic design provides a plurality of conveniently located switches for single handed control of a television, including a multi-position thumb switch which may control TV volume and TV channel selection. The quick access control stick switches may also be user programmable, accommodating individual user preferences. A microprocessor may retain user selected and programmed television channels that may be sequentially accessed by an index-finger trigger switch. Less used television controls, such as picture quality adjustments, may be located on a television control panel on the base. Similarly, less used DVD controls may also be located on a control panel on the base. Batteries, mounted within the fixed base, provide weight to keep the remote control upright.

BRIEF DESCRIPTION OF THE DRAWINGS

The invention will be better understood and its numerous objects and advantages will become more apparent to those skilled in the art by reference to the following drawings, in conjunction with the accompanying specification, in which.

DETAILED DESCRIPTION OF EMBODIMENTS

Figure 1:
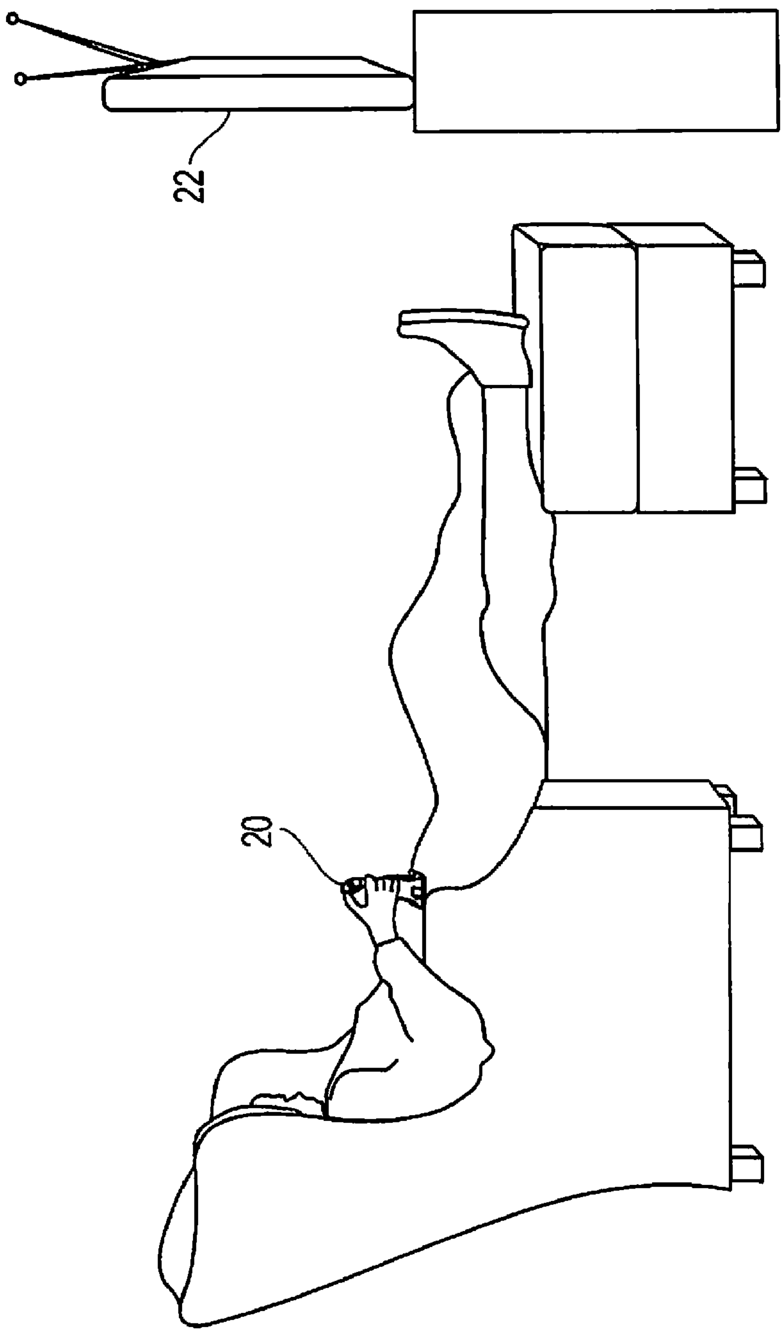
FIG. 1 is a side view of a television control stick remote control device in use.
Figure 2:
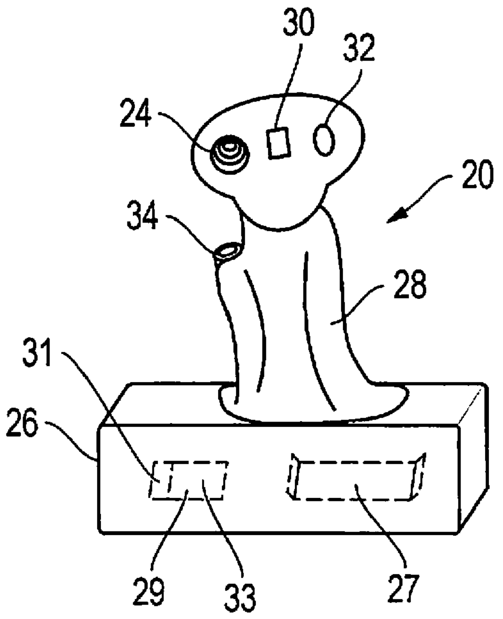
FIG. 2 is a front view of a television control stick remote control device.
Figure 3:
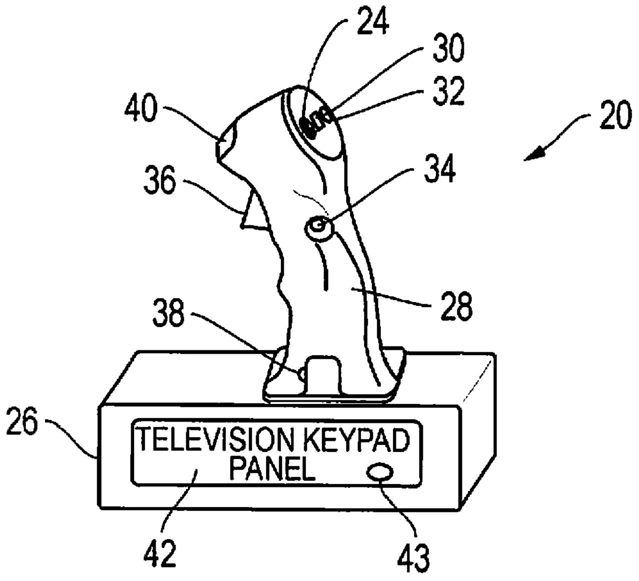
FIG. 3 is a left side view of a television control stick remote control device.

The preferred embodiment of the present invention is shown in FIGS. 1, 2, and 3. The ergonomic television remote control 20 with a housing in the shape of a control stick is shown in FIG. 1, controlled by an operator 21 and interacting with a television receiver 22. The television control stick remote is grasped in a more relaxed grip than conventional remote control devices and provides the operator with switches for the most frequently used TV control inputs directly under the user's hand digits. The control stick remote control unit stands upright and may be stood conveniently on the arm of chair or on a side table when not in use. The upright stance of the control stick remote unit, unlike flat conventional remote controls, is less likely to be lost in the folds and pillows of an easy-chair or hidden by newspapers and magazines.

FIG. 2 is a front view of the television control stick remote control device 20 with a grip 28 contoured to fit a human hand when the hand is in a relaxed upright handshake position. The grip is similar to aviation control stick grips, preferably with an upright handle bent slightly forward to accommodate the bulge of a human palm at the base of the thumb. The grip is fixed to a base 26. The base 26 houses a battery 27 (shown in phantom) for power supply that may be accessed from the bottom of the base. A four position switch 24 and pushbutton switches 30 and 32 may be positioned conveniently for thumb use, near the top of the control stick. An additional thumb switch 32 may also be located on a thumb rest portion of the grip 28.

FIG. 3 is a left side view of the television control stick device 20. An infrared diode and lens cover 40 may be mounted on the top back of the control stick base 26. A trigger switch 36 is also mounted to the top back of the control stick grip, conveniently positioned for index finger use. A television key pad panel 42, mounting preferably in a recess on the left side of the base 26, contains switches found on most TV remote controls, such as buttons for individual digits 0 through 9 for channel selection, menu selection, timer input, picture quality controls, and the like. The circuitry, within the television control stick device, is well known in the television electronics industry and therefore not shown. The circuitry may be described as generally including a microprocessor 29 (shown in phantom in FIG. 2) having electrical circuitry 33 to assign user programmable functions to the control stick switches, provide a memory 31 for several user selectable television channels, accept and decode commands from the control stick switches and the television keypad panel, and to generate coded signals corresponding to user inputs, and driver circuitry to drive the infrared diode 40.

In the preferred manner of using this invention, although somewhat intuitive, the grip 28 is grasped with fingers curled around the device and thumb poised to operated the various thumb switches. The device is directed naturally towards the television by the operator positioning to view the television 22, so that the infrared diode 40 can transmit control signals to the television. The control stick switches are preprogrammed, although a user may elect to reprogram the function of the control stick switches to accommodate individual needs. Preferably, power to the television is controlled by thumb switch 30 and volume is muted by thumb switch 32. The four position thumb switch 24 increases volume when pushed upward, decreases volume when pushed downward, increases channel selection when pushed to the right, and decreases channel selection when pushed to the left. Thumb switch 34 adds the channel selection being viewed to the quick access memory and little finger switch 38 deletes the channel selection being viewed from the quick access memory. The index finger trigger switch 36 will sequentially change the channel selection being viewed to the next channel selection in the quick access memory. Other television control functions and the reprogramming of the control stick switch functions is controlled by user inputs through the television keypad panel 42.

The user may elect to reprogram the fore mentioned control stick functions by first pressing a reprogram button 43 on the television keypad panel 42. The micro processor 29 retains a memory of and displays a sequential list of the control stick functions (such as increase volume, decrease volume, increase channel selection, decrease channel selection and so forth) on the television 22. The user selects and activates the desired control stick switch to assign the displayed function to that switch. The next control stick function is indicated on the television and the user activates another control stick switch to assign the presently displayed function to the newly activated switch. In a similar manner, the remaining control stick functions are assigned.

Figure 4:
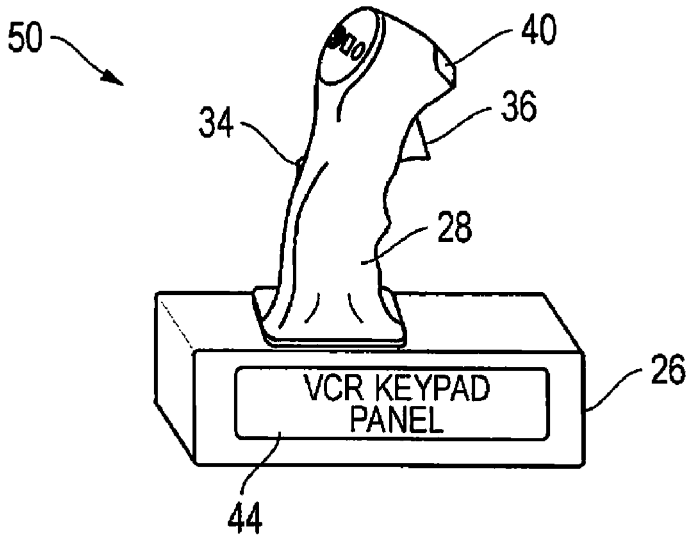
FIG. 4 is a right side view of an alternative embodiment of the present invention illustrating a television and VCR control stick remote control device.

FIG. 4 is a right side view of a first alternative embodiment of the present invention showing a television and VCR control stick remote control device 50. The front and left views of the television and VCR remote control unit are the same as the front and left views of the television control stick 20, refer to FIGS. 2 and 3 and preferably retain the same functions as the television control stick remote control. A VCR keypad panel 44 is mounted in a recess in the right side of the base 26. The VCR keypad panel buttons and associated circuitry are common and well known in the electronics industry and are interconnected with the infrared diode 40 in a similar manner as the television keypad panel 42 in FIG. 3. The control stick switch functions may be reprogrammed by the operator to frequently used VCR control functions in a similar manner to the reprogramming of the television control stick remote.

Figure 5:
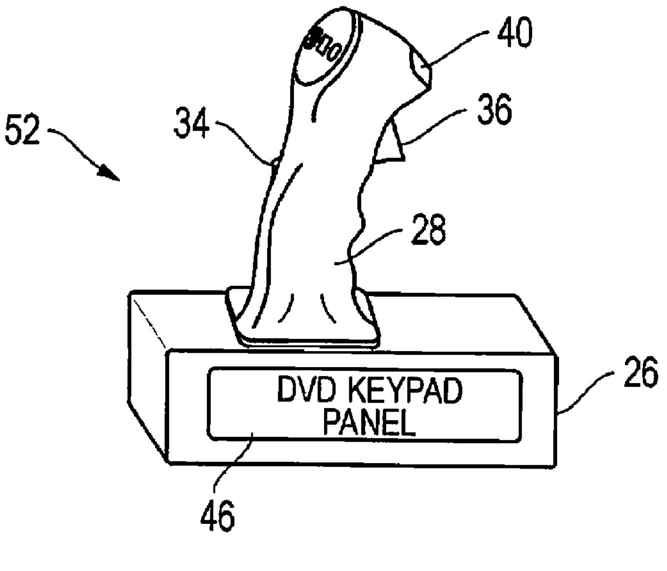
FIG. 5 is a right side view of another alternative embodiment of the present invention illustrating a television and DVD control stick remote control device.

FIG. 5 is a right side view of a second alternative embodiment of the present invention showing a television and DVD control stick remote control device 52. The front and left views of the television and DVD remote control unit are the same as the front and left views of the television control stick 20, refer to FIGS. 2 and 3 and preferably retain the same functions as the television control stick remote control. A DVD keypad panel 46 is mounted in a recess in the right side of the base 26. The VCR keypad panel buttons and associated circuitry are common and well known in the electronics industry and are interconnected with the infrared diode 40 in a similar manner as the television keypad panel 42 in FIG. 3. The control stick switch functions may be reprogrammed by the operator to frequently used DVD control functions in a similar manner as discussed for the television control stick remote.

Figure 6:
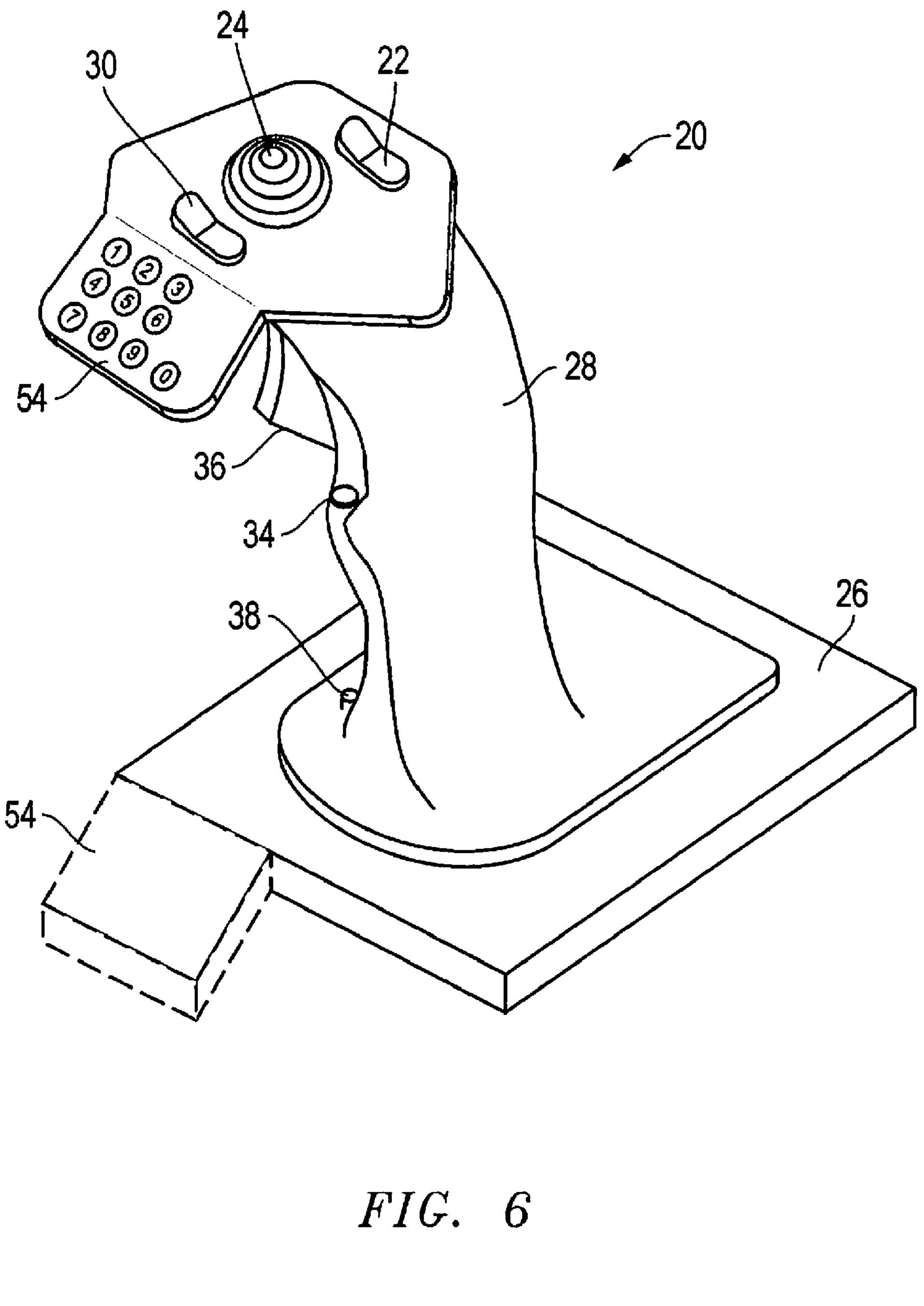
FIG. 6 is a left side view of yet another embodiment of the television control stick remote control device showing additional switches on the control stick grip.

FIG. 6 is a left side view of a third alternative embodiment of the television control stick remote control device 20. The four position thumb switch 24 is repositioned in the middle a the top front of the control stick grip 28 and the four position thumb switch is flanked by two rocker switches 30 and 32. A small digit keypad 54 may extend from the top left side of the control stick grip, allowing an operator to directly select a given television channel. The digit key pad, providing easy access for an operator's left hand, may alternatively be mounted on the left side of the base 26. A index finger trigger switch 36, a thumb switch 34, and a little finger switch 38 may be mounted as discussed above.

It is thus believed that the operation and construction of the present invention will be apparent from the foregoing description. While the device shown and described has been characterized as being preferred, it will be readily apparent that various changes and modifications could be made therein without departing from the scope of the invention as defined in the following claims.

What is claimed is:

1. An ergonomic remote control device for the remote control of a television set, the remote control device comprising:

a cylindrical housing substantially in the shape of a aviation control stick, adapted for being held by a human hand and being manipulated by the digits of the same hand, fixed to a base such that the housing will stand upright, a plurality of control switches mounted on said control stick positioned to be manipulated by the digits of the same hand while holding the cylindrical housing in the palm of the hand, an infrared transmitting light diode housed in said control stick for transmitting television viewing control signals to a television set, an electrical circuit contained within said housing capable of encoding signals from said plurality of control switches for transmission through said infrared light diode, and a power supply mounted within said housing for suppling power for said electrical circuitry.

2. The ergonomic remote control device of claim 1 wherein said plurality of switches comprises at least one readily available thumb switch mounted near the top front face of the control stick.

3. The ergonomic remote control device of claim 2 wherein said thumb switch is a four position switch.

4. The ergonomic remote control device of claim 3 wherein said four position switch controls the television volume and the television channel selection.

5. The ergonomic remote control device of claim 1 wherein the control functions of the various said plurality of switches are user programmable.

6. The ergonomic remote control of claim 2 wherein said thumb switch is a five position switch controlling the television up volume, down volume, mute, channel up, and channel down functions.

7. The ergonomic remote control device of claim 2 wherein said plurality of switches further comprises at least one readily available finger trigger switch mounted on the back upper portion of the control stick.

8. The ergonomic remote control device of claim 7 wherein:

said electrical circuit is further adapted with a memory for retaining a plurality user programmable television channels, said memory being successively accessed by activation of said trigger switch to signal a change in channel.

9. The ergonomic remote control device of claim 1 wherein said power supply source comprises at least one battery mounted within said base.

10. The ergonomic remote control device of claim 9 wherein:

said plurality of switches comprises at least one readily available thumb switch mounted near the top front face of the control stick, said plurality of switches further comprises at least one readily available finger trigger switch mounted on the back upper portion of the control stick, said electrical circuit is further adapted with a memory for retaining a plurality of user programmable television channels, said memory being successively accessed by activation of said trigger switch to signal a change in channel.

11. The ergonomic remote control device of claim 10 wherein:

said plurality of switches further comprises a digit keypad mounted on the upper portion of the control stick, and said readily available thumb switch is a multi-position switch.

12. An ergonomic remote control device for the remote control of a television set and a VCR, the remote control device comprising:

a cylindrical housing substantially in the shape of an aviation control stick, adapted for being held by a human hand and being manipulated by the digits of the same hand, fixed to a base such that the housing will stand upright, a plurality of control switches mounted on said control stick positioned to be manipulated by the digits of the same hand while holding the control stick in the palm of the hand, an infrared transmitting light diode housed in said control stick for transmitting television viewing control signals to a television set and for transmitting VCR control signals to a VCR, wherein the plurality of control switches includes a plurality of VCR control switches and a plurality of television control switches;

an electrical circuit contained within said housing capable of encoding signals from said plurality of control switches for transmission through said infrared light diode, and a power supply mounted within said housing for supplying power for said electrical circuitry.

13. The ergonomic remote control device of claim 11 wherein:

said plurality of switches comprises at least one readily available thumb switch mounted near the top front face of the control stick, said plurality of switches further comprises at least one readily available finger trigger switch mounted on the back upper portion of the control stick, said electrical circuit is further adapted with a memory for retaining a plurality of user programmable television channels, said memory being successively accessed by activation of said trigger switch to signal a change in channel.

14. The ergonomic remote control of claim 13 wherein said thumb switch controls the television up volume, down volume, channel up, and channel down functions.

15. An ergonomic remote control device for the remote control of a television set and a DVD, the remote control device comprising:

a cylindrical housing substantially in the shape of an aviation control stick, adapted for being held by a human hand and being manipulated by the digits of the same hand, fixed to a base such that the housing will stand upright, a plurality of control switches mounted on said control stick positioned to be manipulated by the digits of the same hand while holding the control stick in the palm of the hand, an infrared transmitting light diode housed in said control stick for transmitting television viewing control signals to a television set and for transmitting DVD control signals to a DVD, wherein the plurality of control switches includes a plurality of DVD control switches and a plurality of television control switches;

an electrical circuit contained within said housing capable of encoding signals from said plurality of control switches for transmission through said infrared light diode, and a power supply mounted within said housing for suppling power for said electrical circuitry.

16. The ergonomic remote control device of claim 15 wherein:

said plurality of switches comprises at least one readily available thumb switch mounted near the top front face of the control stick, said plurality of switches further comprises at least one readily available finger trigger switch mounted on the back upper portion of the control stick, said electrical circuit is further adapted with a memory for retaining a plurality user programmable television channels, said memory being successively accessed by activation of said trigger switch to signal a change in channel.

* * * * *